US008163337B2

(12) United States Patent
Guerin et al.

(10) Patent No.: US 8,163,337 B2
(45) Date of Patent: Apr. 24, 2012

(54) VAPOUR DEPOSITION METHOD

(75) Inventors: Samuel Guerin, Southampton (GB); Brian Elliot Hayden, Southampton (GB)

(73) Assignee: University of Southampton, Southampton (GB)

( * ) Notice: Subject to any disclaimer, the term of this patent is extended or adjusted under 35 U.S.C. 154(b) by 766 days.

(21) Appl. No.: 10/575,240

(22) PCT Filed: Oct. 8, 2004

(86) PCT No.: PCT/GB2004/004255
§ 371 (c)(1),
(2), (4) Date: Jan. 30, 2007

(87) PCT Pub. No.: WO2005/035820
PCT Pub. Date: Apr. 21, 2005

(65) Prior Publication Data
US 2007/0275164 A1 Nov. 29, 2007

(30) Foreign Application Priority Data
Oct. 9, 2003 (GB) .................................. 0323671.8

(51) Int. Cl.
*C23C 16/00* (2006.01)
(52) U.S. Cl. .................................................. 427/248.1
(58) Field of Classification Search ................. 427/248.1
See application file for complete search history.

(56) References Cited

U.S. PATENT DOCUMENTS

| 2,676,114 | A | * | 4/1954 | Barkley | 427/248.1 |
| 3,520,716 | A | * | 7/1970 | Okamoto et al. | 427/250 |
| 4,469,719 | A | * | 9/1984 | Martin | 427/255.5 |
| 4,776,938 | A | * | 10/1988 | Abe et al. | 204/192.15 |
| 6,045,671 | A | | 4/2000 | Wu et al. | |
| 6,632,285 | B2 | | 10/2003 | Wang et al. | |

FOREIGN PATENT DOCUMENTS

| JP | 43-27926 | 12/1968 |
| JP | 49-34573 | 9/1974 |
| JP | 2000-503753 | 3/2000 |
| WO | WO 98/47613 | 10/1998 |

OTHER PUBLICATIONS

International Search Report for PCT/GB2004/004255 mailed Mar. 21, 2005.
Search Report under section 17. Application No. GB 0323671.8 Date of search Feb. 16, 2004.
Office Action for Japanese Patent Application No. 2006-530596 dated Feb. 8, 2011.

* cited by examiner

*Primary Examiner* — Kelly M Gambetta
(74) *Attorney, Agent, or Firm* — Pearl Cohen Zedek Latzer, LLP

(57) ABSTRACT

In a vapor deposition method which can be used to deposit mixtures of materials in progressively varying amounts on a substrate (1) and which can be used for a variety of purposes, but is of especial value in combinatorial chemistry, the path of the vaporized material from the source (3) to the substrate (1) is partially interrupted by a mask (5), the positioning of the mask in a plane parallel to the plane defined by the substrate (1) being such that the material is deposited on the substrate (1) in a thickness which increases substantially continuously in a direction along the substrate (1).

2 Claims, 3 Drawing Sheets

VAPOUR DEPOSITION METHOD

CROSS-REFERENCE TO RELATED APPLICATIONS

This application is a National Phase Application of PCT International Application No. PCT/GB2004/004255, International Filing Date Oct. 8, 2004, claiming priority of GB Patent Application, 03230671.8, filed Oct. 9, 2003, both which are incorporated herein by reference in their entirety.

FIELD OF THE INVENTION

The present invention relates to a novel vapour deposition method which can be used to deposit mixtures of materials in progressively varying amounts on a substrate and which can be used for a variety of purposes, but is of especial value in combinatorial chemistry.

BACKGROUND OF THE INVENTION

The basis of combinatorial chemistry is to form large libraries of molecules in a single process step, instead of synthesizing compounds individually, as was hitherto traditional, and to identify the most promising compounds by high throughput screening of the compounds in the libraries. Although originally used mainly in the pharmaceutical industry, it has since found more widespread use throughout the chemical industries, and has been extended to the synthesis of inorganic materials. By application of the present invention, it is possible to apply the techniques of combinatorial chemistry to the preparation of metal alloys and inorganic materials by vapour deposition.

Combinatorial chemistry, as it applies to the present invention, requires the deposition of materials in relative amounts that vary progressively in at least one direction along a substrate. U.S. Pat. No. 6,045,671 discloses a method of achieving this in which a shadow mask or masks is or are moved directly in front of a substrate between a source (of the vapour deposited material) and the substrate, so as to expose positions on the substrate to increasing amounts of material in proportion to the time that these positions lie in direct line of sight of the source. Necessarily, such an arrangement can only be used with a single source at one time. Accordingly, if this process is to be used to produce a mixture of materials, as is necessary for combinatorial chemistry, the coated substrate has to be subjected to a second pass using a second source, and then the deposited material has to be mixed in some way without disturbing the relative concentrations of the materials at different positions on the substrate. According to U.S. Pat. No. 6,045,671, this is done by heated the deposited materials. However, in practice, the effectiveness of heating as a method of mixing can be limited, and it cannot be used at all with heat-sensitive materials.

There is, therefore, a need in combinatorial chemistry for a method for the simultaneous deposition of two or more materials in uniformly varying amounts, the amounts varying according to a pre-arranged pattern according to location on the substrate.

SUMMARY OF THE INVENTION

We have now discovered that this may be achieved without using a moving mask, by careful positioning of a mask between source and target. A further benefit of the inventive method is that it can be used for other purposes than combinatorial chemistry where a progressively varying thickness of one or more materials on a substrate is required.

Thus, the present invention consists in a vapour deposition process, in which a material is vaporised from a source and deposited on a substrate, the path of the vaporised material from the source to the substrate being partially interrupted by a mask, the positioning of the mask in a plane parallel to the plane defined by the substrate being such that the material is deposited on the substrate in a thickness which increases substantially continuously in a direction along the substrate.

The source should be of finite size. As used herein, "finite size" is defined as any source which is not a single point source. It is preferred that the size of the source and the size of the substrate should be of about the same order of magnitude.

Where a further plane is defined by the centres of the source and the substrate and intersecting an edge of the mask, the mask is so positioned that its intersection with that further plane lies within the boundaries defined by the intersection of the surface of the source with the further plane and the lines in that further plane joining each edge of the source with the opposite edge of the substrate.

Preferably, the mask is positioned closer to the source than to the substrate, but in any case sufficiently far from the substrate to produce a range of deposition rates across the sample without movement of the mask during deposition. This contrasts strongly with the method of U.S. Pat. No. 6,045,671, where the mask is positioned immediately next to the substrate, and must be moved during deposition.

If desired, there may be two or more sources, as defined above, depositing material on a single substrate, each source being associated with a mask positioned as defined above and preferably closer to the source than to the substrate, the positioning of the mask in a plane parallel to the plane defined by the substrate being such that the material from each source is deposited on the substrate in a thickness which increases substantially continuously in a direction along the substrate.

In accordance with the present invention, where there is a single mask for a given source, the thickness of the deposited material will vary along one dimension of the substrate. However, if desired, by providing a second mask for a second source, suitably located, the thickness may be caused to vary along two dimensions of the substrate.

Although the mask does not move in the course of the process of the present invention, it is preferably movable so that, with the use of different sources and/or substrates, it can be moved into the appropriate position to produce the required gradient.

By appropriate positioning of the mask, as described in greater detail hereafter, prior to commencing deposition, it is possible, in accordance with the present invention, to pre-determine the gradient of the growth of the wedge of deposited material, from simply linear to any other configuration desired. This allows considerably more flexibility and subtlety in mixing materials, which is an important advantage when used in combinatorial chemistry. As a result, materials may be mixed easily and reliably over a wide range of proportions.

The mask may be of any suitable shape, provided that it can "hide" a part of the source from the substrate. It may be an aperture in a cover located between the source and the substrate. Where there are several sources and correspondingly several masks, this may be the more convenient option.

The source, substrate, vapour deposited material and vapour deposition apparatus are all conventional and are well known to those skilled in the art, and so will not be described in detail herein. Suitable apparatus are typically designed for the deposition of compound semi-conductors, of metals on silicon substrates, in semiconductor fabrication.

The process of the present invention may be applied to many materials, examples of which include: metal alloys (binary, ternary, quaternary etc.) mixed oxides, doped oxides, mixed nitrides etc.

The process will normally take place in a vacuum chamber, as is conventional. Where there are several sources and a single substrate, the sources are preferably arranged approximately equidistant from the axis through the centre of the substrate. The method may also be applied to a source positioned along the centre axis normal to the substrate. As few as 1 or 2 and as many as 6 or 8 sources can be used at the same time.

BRIEF DESCRIPTION OF THE DRAWINGS

The invention is further illustrated by the accompanying drawings, in which.

DETAILED DESCRIPTION OF THE INVENTION

In relation to the drawings, for convenience of description, the word "aperture" is used to indicate any space adjacent the mask which is not interrupted by the mask and which thus allows free passage of material to be deposited from the source to the substrate, whether or not that space is surrounded by the mask.

Figure 1:
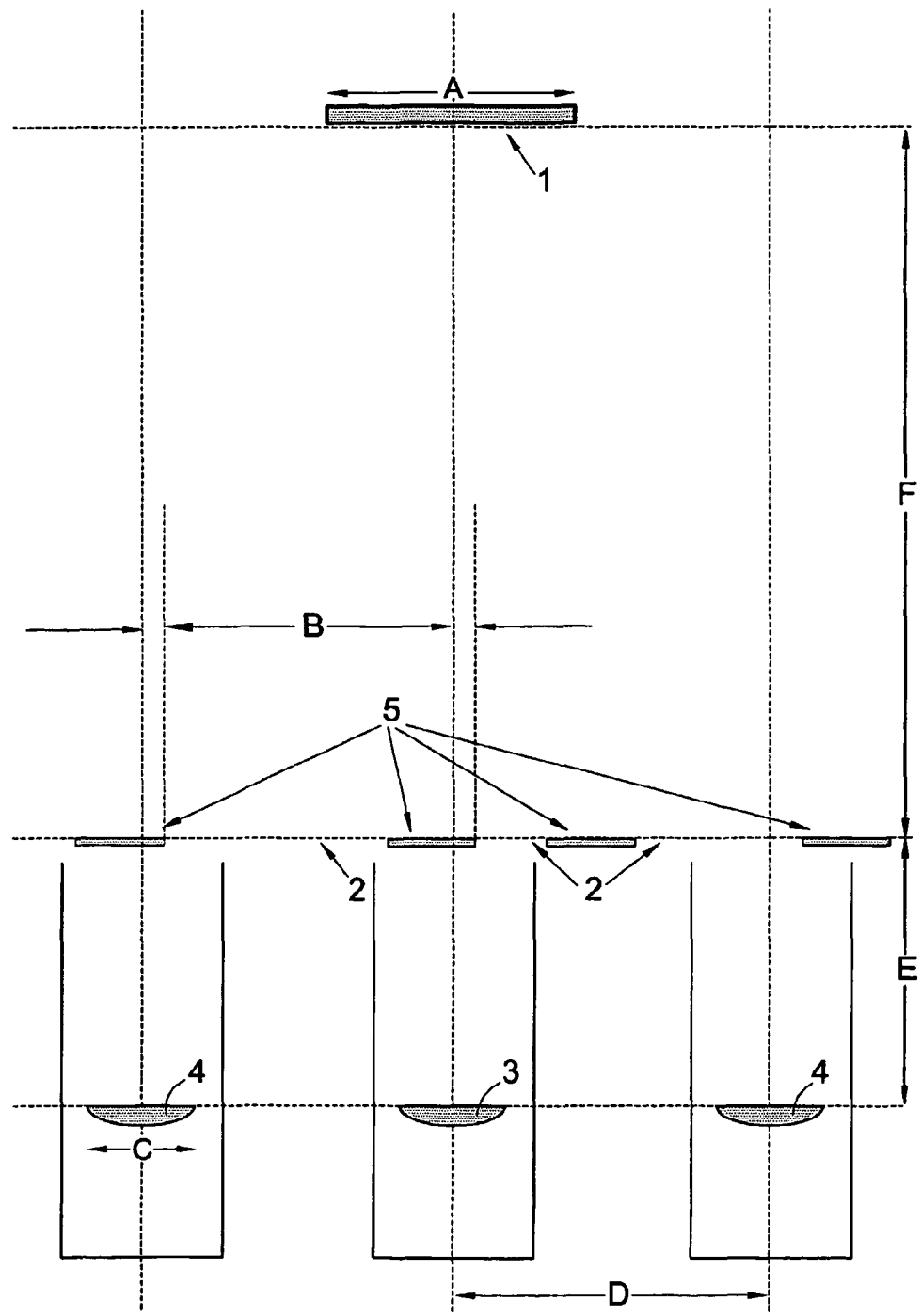
FIG. 1 shows a schematic diagram of a three source physical vapour deposition system for the simultaneous deposition of materials onto a substrate.

The provision of the masks 5 having apertures 2 allows a graded ("Wedge") deposition of each of the materials across the sample 1. The characteristic gradient of the wedge growth is determined by the position of the mask 5 with respect to the sample 1 and the source 3 or 4. By using the wedge growth method on several sources 4 simultaneously allows the deposition of a thin film of variable composition as a function of position across the sample. Although in plane deposition is depicted in FIG. 1, sources may be combined out of plane and mixed compositions of a large number of elements are achievable. This methodology is ideal for high-throughput or combinatorial methodologies of materials growth.

Figure 2:
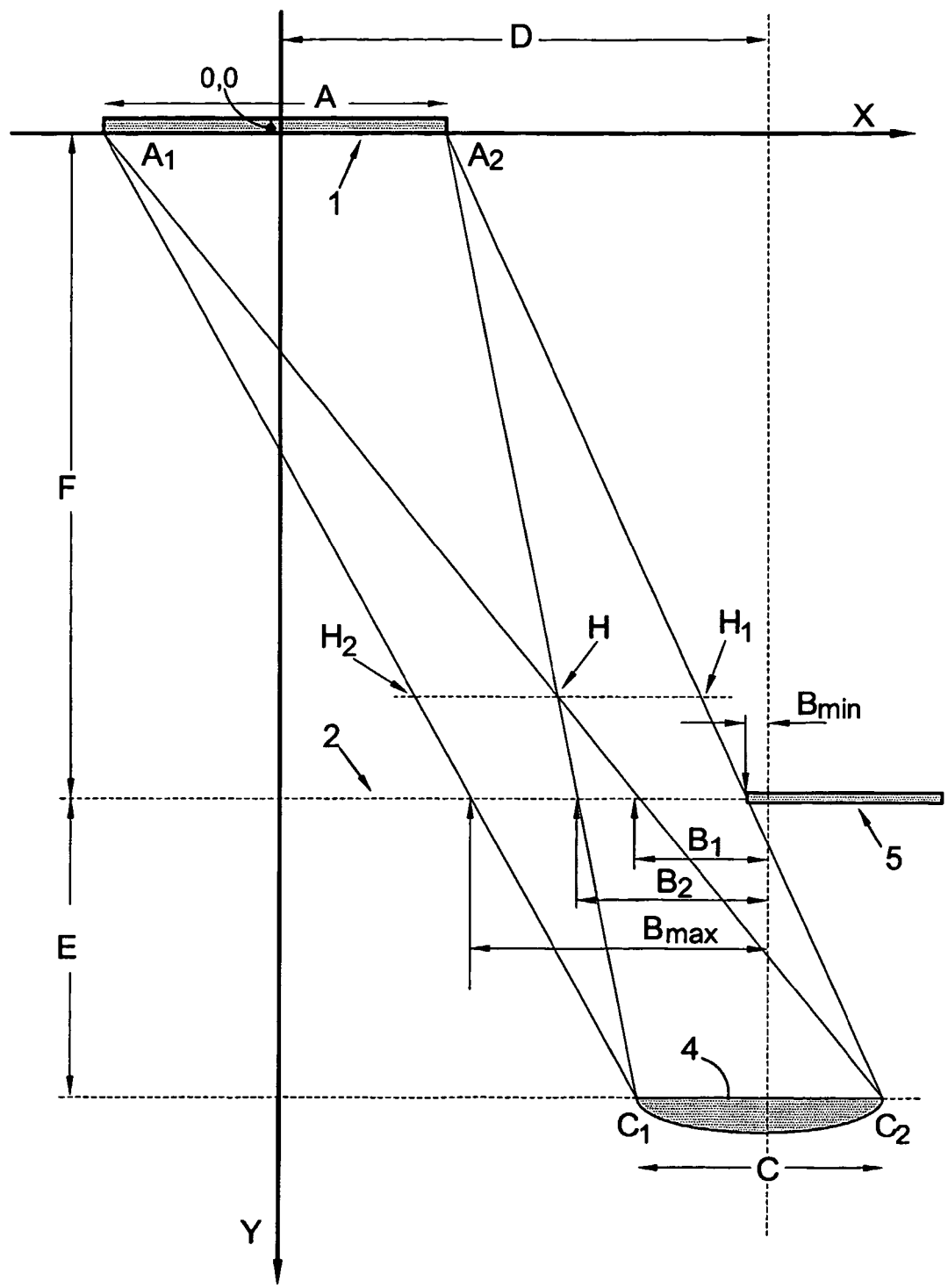
FIG. 2 shows in more detail a schematic diagram of one of the off-centre sources of FIG. 1.

In order to establish the conditions required for optimal wedge growth, deposition has been simulated for a number of geometries. Simulations have been carried out for a source of providing constant flux across its face, and this can be modified to include variations across the face of the source in the cases of, for example, locally heated e-beam sources. The simulation is carried out in two dimensions, since this provides sufficient detail to in a first approximation to predict the wedge growth. FIG. 2 shows the detailed geometric arrangement, defined lengths and positions of a typical "off axis" source 4. Note that similar effects are achievable with an on axis source 3. Note that the origin to which distances are referenced (0,0) is defined as the centre of the sample face.

A Sample size
$A_1$ and $A_2$ The points of the extremities of the sample.
B Offset of mask with respect to the axis centre of the source. The mask is shown in the position $B_{min}$.
C Source size (as defined by the finite region from which the source material emanates).

$C_1$ and $C_2$ The points of the extremities of the source size.
D Offset of source with respect to the sample.
E Source to mask distance
F Mask to sample distance Four points of interest can be defined for the position of the mask in x with respect to the projected flux of the source. They correspond to the intersection of the mask with the line of sight of the extremities of the source and sample (lines $A_1$, $C_1$, $A_2$, $C_2$). Those four points have been defined as $B_{min}$, $B_1$, $B_2$ and $B_{max}$. The position of the mask corresponding to these positions can be calculated geometrically.

$B_{min}$ is defined as the point at which the mask cuts the line $A_2C_2$, and its position in x with respect to the centre of the source is given by:

$$B_{min} = \frac{1}{2}\left[\frac{(A-2D)E+CF}{(E+F)}\right]$$

$B_{max}$ is defined as the point at which the mask cuts the line $A_1C_1$, and its position in x with respect to the centre of the source is given by:

$$B_{max} = -\frac{1}{2}\left[\frac{(A+2D)E+CF}{(E+F)}\right]$$

$B_1$ is defined as the point at which the mask cuts the line $A_1C_2$, and its position in x with respect to the centre of the source is given by:

$$B_1 = -\frac{1}{2}\left[\frac{(A+2D)E-CF}{(E+F)}\right]$$

$B_2$ is defined as the point at which the mask cuts the line $A_2C_1$, and its position in x with respect to the centre of the source is given by:

$$B_2 = -\frac{1}{2}\left[\frac{(2D-A)E+CF}{(E+F)}\right]$$

A further point of interest can be identified and is labelled H, and is defined as the intersection of the two source flux lines $A_1C_2$ and $A_2C_1$. The coordinates of point H ($H_x$, $H_y$) with respect to the point of origin (the point of origin being the centre of the sample face 0,0) are given by:

$$H_x = \frac{AD}{A+C}$$

$$H_y = \frac{(E+F)A}{A+C}$$

Wedge growth of various qualities is achieved by using an mask that cuts the direct path between the source and the substrate, i.e. the quadrilateral defined by $A_1$, $A_2$, $C_2$, $C_1$ in 2D projection. Simulations show that the triangle defined by H, $C_1$ and $C_2$ gives the region in which the mask cutting the source flux will give rise to linear gradients across the entire sample. For an mask which cuts the flux in all other positions within the region defined by $H_1$, $H_2$, $C_1$ and $C_2$, incomplete or no wedge growth is obtained. In summary:

For $F>H_y$, $B_{min}>B_1>B_2>B_{max}$. If:

$B>B_{min}$ Uniform film (natural profile of unimpeded source)

$B_{min}>B>B1$ Partial gradient across sample (plateau+gradient)

$B_1>B>B_2$ Linear gradient across whole sample $B_2>B<B_{max}$ Partial gradient across sample (gradient+no deposition)

$B_{max}>B$ No deposition

For $F<H_y$, $B_{min}>B_2>B_1>B_{max}$ If:

$B>B_{min}$ Uniform film (natural profile of unimpeded source)

$B_{min}>B>B_2$ Partial gradient across sample (plateau+gradient)

$B_2>B>B_1$ Partial gradient across sample (plateau+gradient+no deposition)

$B_1>B>B_{max}$ Partial gradient across sample (gradient+no deposition)

$B_{max}>B$ No deposition

Hence, in accordance with the present invention, provided the mask is correctly positioned at first, and this can easily be achieved by following the above guidance, a gradient distribution of material is obtained without moving the mask in the course of the deposition process.

Table 1 shows the results of a simulation for a specific growth geometry, calculating the expected deposition profiles for the mask moving across the full range of the source flux to the sample. The fixed values (in mm) used were A=22, C=20, D=162, E=150 and F=350. This gives $B_{min}$=−38.3, $B_1$=−44.9, $B_2$=−52.3 and $B_{max}$=−58.9.

"Maximum Flux" is defined as the maximum percentage of source material deposited on the sample with respect to the amount of material that would have been deposited had no mask been used.

"Minimum Flux" is defined as the minimum percentage of material deposited on the sample with respect to the amount of material that would have been deposited had no mask been used.

The "Normalised Gradient" corresponds to the percentage difference between the maximum and minimum amounts deposited across the sample. Note that the deposition (the way this Normalised Gradient is deposited) does not always take place in a continuous gradient (labelled linear gradient) across the sample.

TABLE 1

| B/mm | Max Flux/ % | Min Flux/ % | Normalised Gradient/% | Predicted Profile |
|---|---|---|---|---|
| −59 | 0 | 0 | 0-0 | No deposit |
| −58 | 5.86 | 0 | 0-100 | No deposit + gradient |
| −57 | 12.69 | 0 | 0-100 | No deposit + gradient |
| −56 | 19.51 | 0 | 0-100 | No deposit + gradient |
| −55 | 26.32 | 0 | 0-100 | No deposit + gradient |
| −54 | 34.08 | 0 | 0-100 | No deposit + gradient |
| −53 | 40.86 | 0 | 0-100 | Linear gradient |
| −52 | 47.63 | 4.00 | 8.4-100 | Linear gradient |
| −51 | 54.39 | 11.00 | 20.22-100 | Linear gradient |
| −50 | 61.13 | 17.98 | 29.42-100 | Linear gradient |
| −49 | 67.87 | 24.96 | 36.77-100 | Linear gradient |
| −48 | 74.59 | 31.92 | 42.80-100 | Linear gradient |
| −47 | 82.26 | 38.87 | 47.26-100 | Linear gradient |
| −46 | 88.96 | 45.82 | 51.51-100 | Linear gradient |
| −45 | 95.64 | 53.74 | 56.19-100 | Linear gradient |
| −44 | 97.77 | 60.66 | 62.05-100 | Linear gradient |
| −43 | 98.18 | 67.57 | 68.82-100 | Plateau + gradient |

TABLE 1-continued

| B/mm | Max Flux/ % | Min Flux/ % | Normalised Gradient/% | Predicted Profile |
|---|---|---|---|---|
| −42 | 98.59 | 74.47 | 75.53-100 | Plateau + gradient |
| −41 | 99.00 | 81.3 | 82.18-100 | Plateau + gradient |
| −40 | 99.41 | 88.24 | 88.76-100 | Plateau + gradient |
| −39 | 99.70 | 95.10 | 95.38-100 | Plateau + gradient |
| −38 | 100.00 | 97.55 | 97.55-100 | Natural profile of source |

Figure 3:
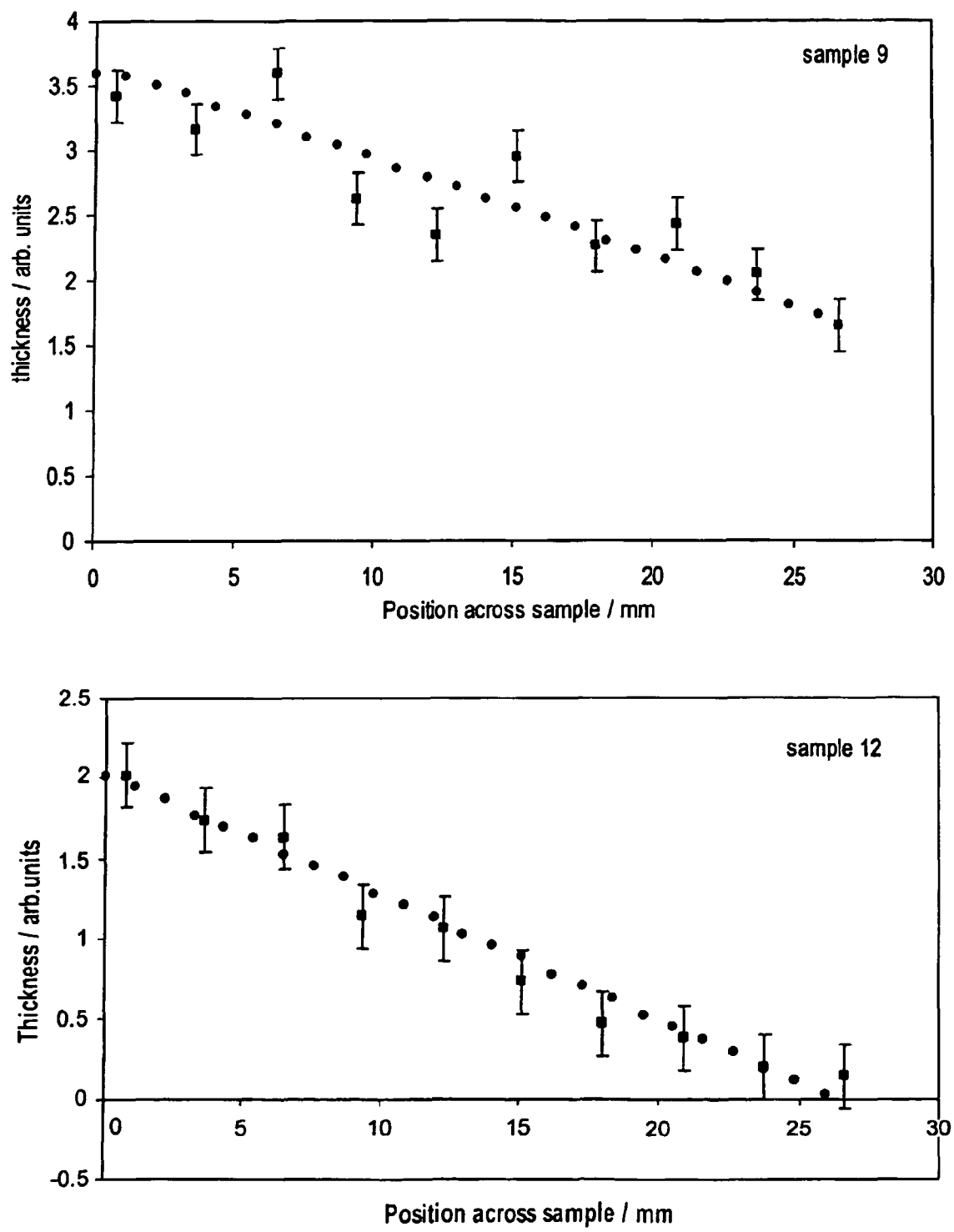
FIG. 3 shows a plot of thickness against position of two samples prepared using a single source, as described in more detail hereafter.

FIG. 3 shows the results of simulations, and corresponding experimental data, for the deposition of gold on a SiN substrate. The source was a Knudsen cell with dimension C=20 mm, A=26 mm, E=350 mm, F=150 mm and D=162 mm. B was varied for the 2 examples between B=−51.8 mm for sample 9 and B=−45 mm for sample 12.

The invention claimed is:

1. A method of simultaneously depositing at least two different vapor materials on a single substrate, the method comprising:

providing at least two vapor sources, each vapor source having a planar face;

positioning a mask between each of said at least two vapor sources and said substrate, such that there is a separate mask between each vapor source and said substrate, each mask being positioned in a first plane that is parallel to a plane defined by the substrate, wherein for each mask a second plane is defined by the center of the associated vapor source, the center of the substrate and an edge of the mask;

vaporizing a different material from said face of each of said vapor sources; and depositing the vaporized material from each vapor source onto the substrate, wherein the path of the vaporized material from each vapor source to the substrate is partially interrupted by a corresponding mask, wherein each mask is positioned in said first plane such that the vaporized material is deposited on the substrate in a thickness that varies progressively so as to increase substantially continuously in a direction along the substrate;

wherein each mask is positioned such that its intersection with the second plane lies within the quadrilateral area of the second plane defined by the points of the extremities of the substrate lying within the second plane and the points of the extremities of the source lying within the second plane; and wherein each mask is further positioned such that the first plane is at a perpendicular distance of greater than $H_y$ from the plane defined by the substrate, wherein $H_y$ is given by:

$$H_y = \frac{(E+F)A}{A+C}$$

wherein for each mask and its associated vapor source:

E is the source to mask distance, said distance being defined as the perpendicular distance from the source to the first plane;

F is the mask to substrate distance, said distance being defined as the perpendicular distance from the first plane to the plane defined by the substrate;

A is the substrate size, said substrate size being defined as the distance between the points of the extremities of the substrate lying within the second plane; and C is the source size, said source size being defined as the distance between the points of the extremities of the source lying within the second plane; and wherein each mask is moveable prior to commencing deposition in order to pre-determine the gradient of deposition of each material but is not moved in the course of the deposition method.

2. The method of claim 1, wherein, for each mask and its associated vapor source, the edge of the mask intersecting the second plane is within the triangular area of the second plane defined by the points of the extremities of the source lying within the second plane and a point H lying within the second plane, wherein the point H has the coordinates $H_x$, $H_y$ with respect to the center of the substrate within the second plane, the x-axis being defined by the intersection of the substrate face with the second plane and the y-axis being perpendicular thereto and within the second plane, and wherein $H_y$ is as defined in claim 1 and $H_x$ is given by:

$$H_x = \frac{AD}{A+C}$$

wherein:

A and C are as defined in claim 1; and

D is the offset of the source with respect to the substrate, said offset being defined as the distance between the y-axis and the parallel axis containing the center of the source.

* * * * *